United States Patent
Chiu et al.

(10) Patent No.: US 7,804,154 B2
(45) Date of Patent: Sep. 28, 2010

(54) SEMICONDUCTOR DEVICE STRUCTURE AND FABRICATING METHOD THEREOF

(75) Inventors: Kai-Ling Chiu, Pingtung County (TW); Chih-Yu Tseng, Hsinchu (TW); Victor Chiang Liang, Hsinchu (TW); You-Ren Liu, Kaohsiung (TW); Chih-Chen Hsueh, Kaohsiung (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 0 days.

(21) Appl. No.: 12/333,020

(22) Filed: Dec. 11, 2008

(65) Prior Publication Data

US 2010/0148263 A1    Jun. 17, 2010

(51) Int. Cl.
*H01L 29/00* (2006.01)

(52) U.S. Cl. ............... 257/536; 257/538; 257/E21.004

(58) Field of Classification Search ................. 257/536, 257/538
See application file for complete search history.

(56) References Cited

U.S. PATENT DOCUMENTS

| | | | | |
|---|---|---|---|---|
| 5,466,484 A | * | 11/1995 | Spraggins et al. | 438/385 |
| 5,661,325 A | * | 8/1997 | Hayashi et al. | 257/393 |
| 5,977,598 A | * | 11/1999 | Chen et al. | 257/380 |
| 6,603,172 B1 | * | 8/2003 | Segawa et al. | 257/328 |
| 2006/0102963 A1 | | 5/2006 | Huang | |

* cited by examiner

*Primary Examiner*—Wai-Sing Louie
(74) *Attorney, Agent, or Firm*—Winston Hsu

(57) ABSTRACT

A semiconductor device structure including a substrate, a resistor, and a first gate structure is provided. The substrate includes a resistor region and a metal-oxide-semiconductor (MOS) transistor region. The resistor is disposed on the substrate within the resistor region. The resistor includes a first dielectric layer, a metal layer, a second dielectric layer, and a semiconductor layer sequentially stacked on the substrate. The first gate structure is disposed on the substrate within the MOS transistor region. The first gate structure includes the first dielectric layer, the metal layer, and the semiconductor layer sequentially stacked on the substrate.

10 Claims, 3 Drawing Sheets

SEMICONDUCTOR DEVICE STRUCTURE AND FABRICATING METHOD THEREOF

BACKGROUND OF THE INVENTION

1. Field of the Invention

The present invention generally relates to a semiconductor device structure and a fabricating method thereof, and more particularly, to a resistor structure and a fabricating method thereof.

2. Description of Related Art

In the present age of information explosion, integrated circuits (ICs) have been broadly applied in every aspect of our daily life. Resistor device is one of the most indispensable passive devices in circuit design and application and which is applied to various electronic products, such as memories and logic circuits.

In a conventional IC, resistors are usually made of lightly doped polysilicon, and resistors having different resistances are usually made by using strip-shaped polysilicon having different cross-sectional areas and lengths.

More personalized and complicated electronic products have been constantly promoted along with the advancement of the electronic technology, and the design of every electronic product has been going towards lightweight and slimness in order to provide more comfort to the users.

Accordingly, metal gates are usually adopted in order to improve the efficiency of metal-oxide-semiconductor (MOS) transistor devices. Thus, in a process for integrating a MOS transistor device and a resistor, a polysilicon layer in the resistor is formed on a metal layer and which results in reduction of the resistance of the resistor and accordingly reduces the efficiency thereof.

SUMMARY OF THE INVENTION

Accordingly, the present invention is directed to a semiconductor device structure which can increase the resistance of a resistor.

The present invention is also directed to a method for fabricating a semiconductor device, wherein the efficiency of a resistor is effectively improved.

The present invention provides a semiconductor device structure including a substrate, a resistor, and a first gate structure. The substrate includes a resistor region and a metal-oxide-semiconductor (MOS) transistor region. The resistor is disposed on the substrate within the resistor region. The resistor includes a first dielectric layer, a metal layer, a second dielectric layer, and a semiconductor layer sequentially stacked on the substrate. The first gate structure is disposed on the substrate within the MOS transistor region. The first gate structure includes the first dielectric layer, the metal layer, and the semiconductor layer sequentially stacked on the substrate.

According to the foregoing semiconductor device structure in an embodiment of the present invention, the substrate further includes an electrostatic discharge (ESD) protection device region.

According to the foregoing semiconductor device structure in an embodiment of the present invention, the semiconductor device structure further includes a second gate structure disposed on the substrate within the ESD protection device region. The second gate structure includes the first dielectric layer, the metal layer, the second dielectric layer, and the semiconductor layer sequentially stacked on the substrate, wherein the second dielectric layer is disposed on a portion of the metal layer, and the semiconductor layer is disposed on the second dielectric layer and the metal layer.

According to the foregoing semiconductor device structure in an embodiment of the present invention, the substrate within the resistor region includes an isolation structure, and the resistor is disposed on the isolation structure.

According to the foregoing semiconductor device structure in an embodiment of the present invention, the isolation structure may be a shallow trench isolation structure.

According to the foregoing semiconductor device structure in an embodiment of the present invention, the first dielectric layer includes a composite dielectric layer composed of a plurality of dielectric layers.

According to the foregoing semiconductor device structure in an embodiment of the present invention, a material of the metal layer includes tungsten (W), titanium nitride (TiN), tantalum nitride (TaN), tantalum carbide (TaC), tantalum silicon nitride (TaSiN) or aluminum (Al).

According to the foregoing semiconductor device structure in an embodiment of the present invention, a material of the second dielectric layer includes silicon oxide or silicon nitride.

According to the foregoing semiconductor device structure in an embodiment of the present invention, a material of the semiconductor layer includes doped polysilicon.

The present invention provides a method for fabricating a semiconductor device structure. The method includes following steps. First, a substrate is provided, wherein the substrate includes a resistor region. Then, a first dielectric layer is formed on the substrate. Next, a metal layer is formed on the first dielectric layer. After that, a second dielectric layer which is patterned is formed on the metal layer, wherein the second dielectric layer is located within the resistor region. Thereafter, a semiconductor layer is formed on the substrate, wherein the semiconductor layer covers the metal layer and the second dielectric layer. Then, a patterned mask layer is formed on the semiconductor layer, wherein the patterned mask layer within the resistor region is located above the second dielectric layer. Next, a portion of the semiconductor layer, a portion of the second dielectric layer, a portion of the metal layer, and a portion of the first dielectric layer are removed with the patterned mask layer as a mask to define a resistor within the resistor region. After that, the patterned mask layer is removed.

According to the foregoing method for fabricating a semiconductor device structure in an embodiment of the present invention, the step of defining the resistor further includes defining a first gate structure within a MOS transistor region of the substrate, wherein the first gate structure includes the first dielectric layer, the metal layer, and the semiconductor layer sequentially stacked on the substrate.

According to the foregoing method for fabricating a semiconductor device structure in an embodiment of the present invention, the method further includes defining a second gate structure within an ESD protection device region of the substrate, wherein the second gate structure includes the first dielectric layer, the metal layer, the second dielectric layer, and the semiconductor layer sequentially stacked on the substrate, the second dielectric layer is disposed on a portion of the metal layer, and the semiconductor layer is disposed on the second dielectric layer and the metal layer.

According to the foregoing method for fabricating a semiconductor device structure in an embodiment of the present invention, a photomask used for forming the second dielectric layer includes a salicide block (SAB) layer formation photomask.

According to the foregoing method for fabricating a semiconductor device structure in an embodiment of the present invention, the second dielectric layer within the resistor region has a first width, and the patterned mask layer within the resistor region has a second width, wherein the second width is smaller than the first width.

According to the foregoing method for fabricating a semiconductor device structure in an embodiment of the present invention, the substrate within the resistor region includes an isolation structure, and the resistor is formed on the isolation structure.

According to the foregoing method for fabricating a semiconductor device structure in an embodiment of the present invention, the first dielectric layer includes a composite dielectric layer composed of a plurality of dielectric layers.

According to the foregoing method for fabricating a semiconductor device structure in an embodiment of the present invention, the method of removing the patterned mask layer includes performing a dry etching process or a wet etching process.

As described above, the present invention provides a semiconductor device structure, wherein a second dielectric layer in a resistor separates a metal layer and a semiconductor layer so that the resistance of the resistor can be effectively increased. Besides, the second dielectric layer is not formed in a first gate structure so that the device characteristics of a MOS transistor within a MOS transistor region is not affected.

Additionally, the present invention provides a fabricating method of a semiconductor device structure. A highly efficient resistor can be fabricated through this fabricating method, and the fabricating processes of the resistor and other semiconductor devices can be integrated.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
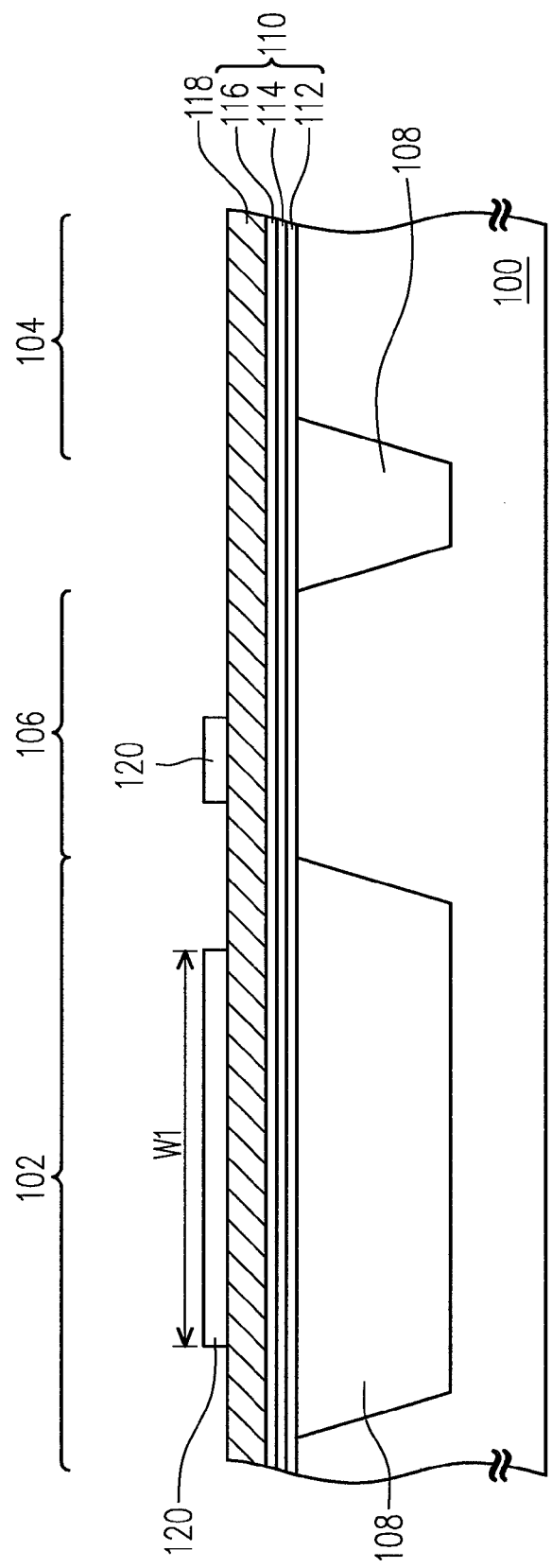
FIGS. 1A~1C are cross-sectional diagrams illustrating a fabricating process of a semiconductor device structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention provides a method for fabricating a semiconductor device structure, wherein the fabricating processes of a resistor and other semiconductor devices can be integrated. Below, an embodiment of the present invention will be described, wherein a resistor, a gate structure of a metal-oxide-semiconductor (MOS) transistor, and a gate structure of an electrostatic discharge (ESD) protection device are fabricated together.

Figure 1B:
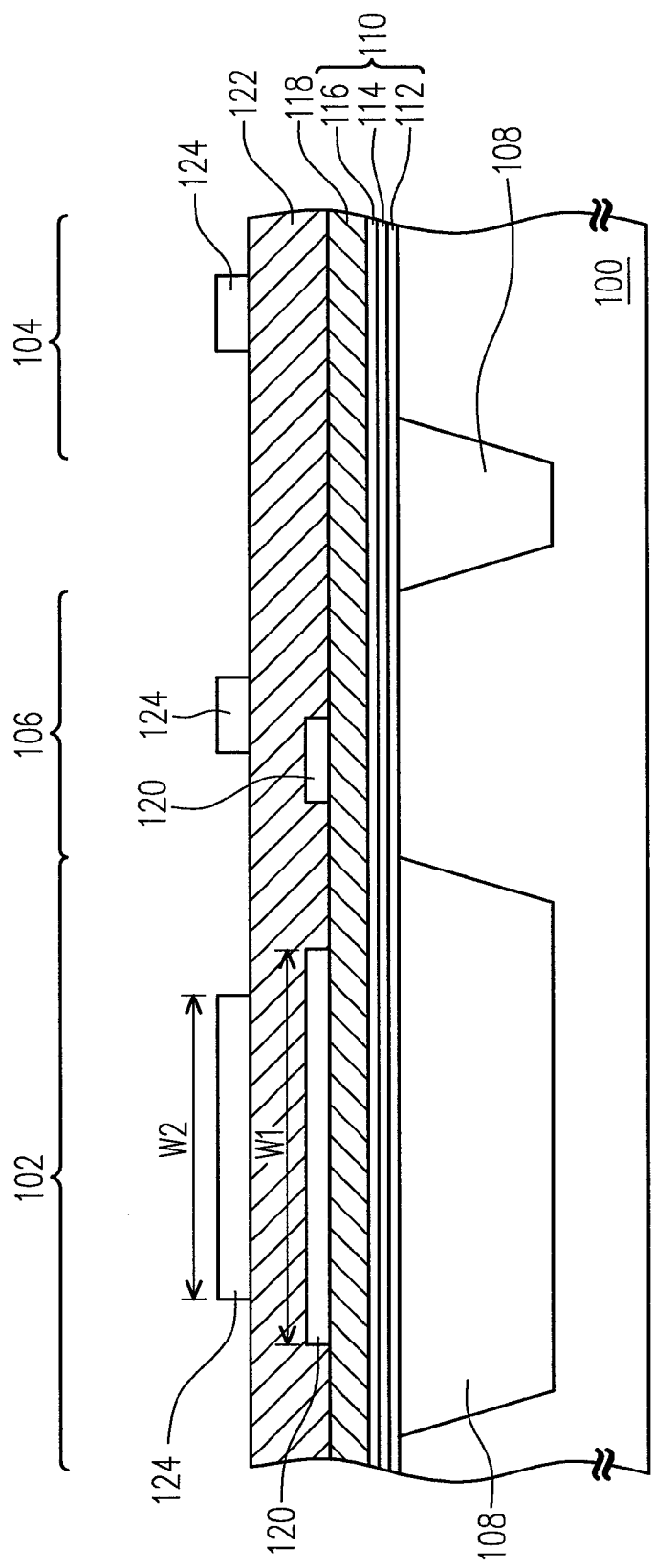
Figure 1C:
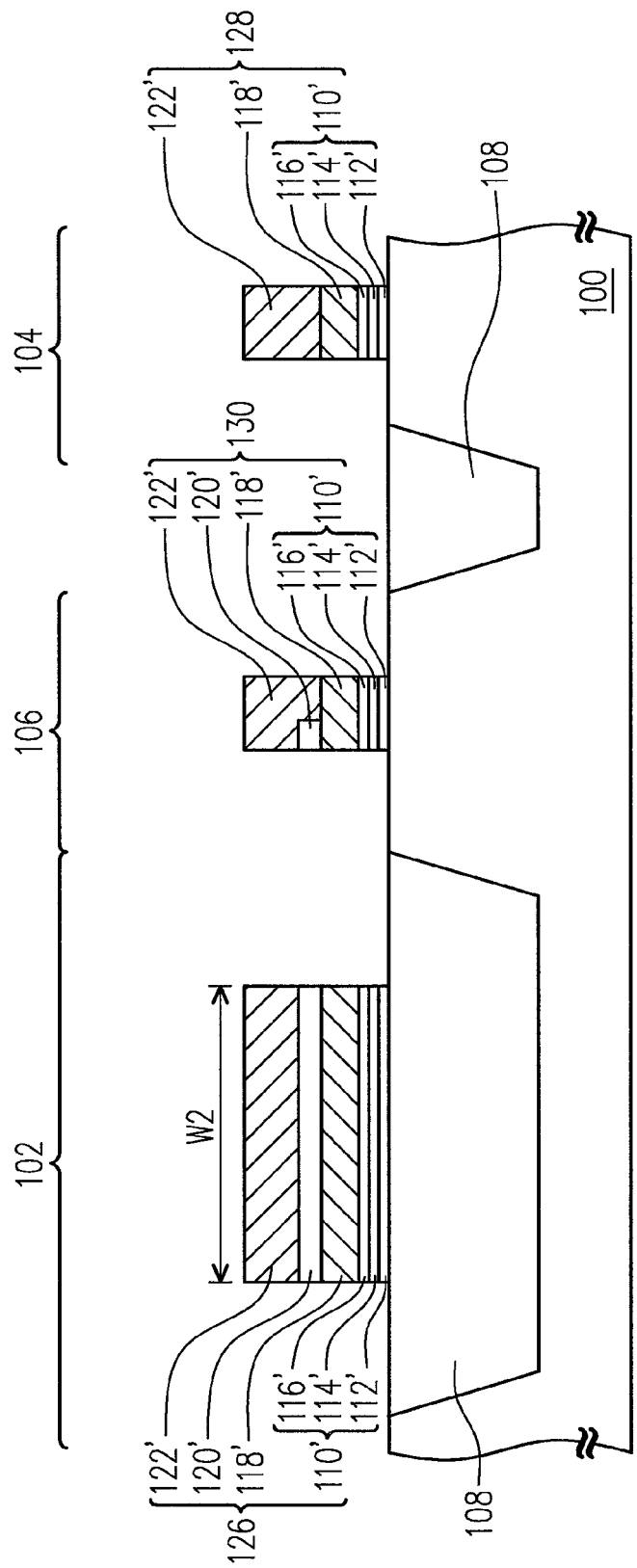

FIGS. 1A~1C are cross-sectional diagrams illustrating a fabricating process of a semiconductor device structure according to an embodiment of the present invention.

First, referring to FIG. 1A, a substrate 100 is provided. The substrate 100 includes a resistor region 102, a MOS transistor region 104, and an ESD protection device region 106. An isolation structure 108 may have been formed in the substrate 100, wherein the isolation structure 108 may be a shallow trench isolation structure. In the present embodiment, the resistor region 102 is located at one side of the ESD protection device region 106, and the MOS transistor region 104 is located at the other side of the ESD protection device region 106. However, the relative positions of the resistor region 102, the MOS transistor region 104, and the ESD protection device region 106 are not limited thereto. For example, in another embodiment of the present invention, the resistor region 102 may be located at one side of the MOS transistor region 104, and the ESD protection device region 106 may be located at the other side of the MOS transistor region 104.

Then, a dielectric layer 110 is formed on the substrate 100. The dielectric layer 110 may be a single-layered dielectric layer or a composite dielectric layer composed of a plurality of dielectric layers. In the present embodiment, the dielectric layer 110 is a composite dielectric layer composed of a dielectric layer 112, a dielectric layer 114, and a dielectric layer 116. The dielectric layer 112 may be made of silicon oxide. The dielectric layer 114 may be made of a dielectric material having a high dielectric constant. The dielectric layer 116 may be made of aluminum oxide or lanthanum oxide ($La_2O_3$). The dielectric layer 110 may be formed through chemical vapour deposition (CVD).

Next, a metal layer 118 is formed on the dielectric layer 110. The metal layer 118 may be made of tungsten, titanium nitride, tantalum nitride, tantalum carbide, tantalum silicon nitride or aluminum. The metal layer 118 may be formed through CVD or physical vapour deposition (PVD) according to the material thereof.

Thereafter, a patterned dielectric layer 120 is formed on the metal layer 118, wherein the dielectric layer 120 is located within the resistor region 102, and no dielectric layer 120 is formed within the MOS transistor region 104. The dielectric layer 120 may have a first width W1. The dielectric layer 120 may be made of silicon oxide or silicon nitride. The dielectric layer 120 may be formed by forming a dielectric material layer (not shown) on the metal layer 118 through CVD and then patterning the dielectric material layer. The photomask used in the patterning process for forming the dielectric layer 120 is a salicide block (SAB) layer formation photomask which is subsequently used for forming a salicide. As a result, the number of photomasks used, and accordingly the fabricating cost, is reduced.

Additionally, while forming the dielectric layer 120 by using the SAB layer formation photomask, the dielectric layer 120 is also formed on the metal layer 118 within the ESD protection device region 106. In another embodiment of the present invention, the dielectric layer 120 may not be formed within the ESD protection device region 106 if the dielectric layer 120 is formed by using another photomask instead of the SAB layer formation photomask.

Thereafter, referring to FIG. 1B, a semiconductor layer 122 is formed on the substrate 100, wherein the semiconductor layer 122 covers the metal layer 118 and the dielectric layer 120. The semiconductor layer 122 may be made of a semiconductor material, such as doped polysilicon. The semiconductor layer 122 may be formed through CVD.

After that, a patterned mask layer 124 is formed respectively on the semiconductor layer 122 within the resistor region 102, the MOS transistor region 104, and the ESD protection device region 106, wherein the patterned mask layer 124 within the resistor region 102 is located above the dielectric layer 120. The patterned mask layer 124 can be used for defining a resistor within the resistor region 102, a gate structure within the MOS transistor region 104, and a gate structure within the ESD protection device region 106. The patterned mask layer 124 within the resistor region 102 may have a second width W2, wherein the second width W2 may be smaller than the first width W1. The patterned mask layer 124 may be made of silicon nitride. The patterned mask layer 124 may be formed by forming a mask layer (not shown) on the semiconductor layer 122 through CVD and then patterning the mask layer.

Next, referring to FIG. 1C, a portion of the semiconductor layer 122, a portion of the dielectric layer 120, a portion of the metal layer 118, and a portion of the dielectric layer 110 are removed with the patterned mask layer 124 as a mask to form a semiconductor layer 122', a dielectric layer 120', a metal layer 118', and a dielectric layer 110' composed of a dielectric layer 112', a dielectric layer 114', and a dielectric layer 116'. The portion of the semiconductor layer 122, the portion of the dielectric layer 120, the portion of the metal layer 118, and the portion of the dielectric layer 110 may be removed through dry etching or wet etching.

Accordingly, a resistor 126 is defined within the resistor region 102, a gate structure 128 is defined within the MOS transistor region 104, and a gate structure 130 is defined within the ESD protection device region 106. The resistor 126 includes the dielectric layer 110', the metal layer 118', the dielectric layer 120', and the semiconductor layer 122' sequentially stacked on the isolation structure 108. The gate structure 128 includes the dielectric layer 110', the metal layer 118', and the semiconductor layer 122' sequentially stacked on the substrate 100. The gate structure 130 includes the dielectric layer 110', the metal layer 118', the dielectric layer 120', and the semiconductor layer 122' sequentially stacked on the substrate 100, wherein the dielectric layer 120' is disposed on a portion of the metal layer 118', and the semiconductor layer 122' is disposed on the dielectric layer 120' and the metal layer 118'.

It should be noted that when the second width W2 of the patterned mask layer 124 is smaller than the first width W1 of the dielectric layer 120, the dielectric layer 120 having the first width W1 can be patterned into the dielectric layer 120' having the second width W2 so that the dielectric layer 120' can effectively separate the semiconductor layer 122' and the metal layer 118'.

Thereafter, the patterned mask layer 124 is removed. The patterned mask layer 124 may be removed through dry etching or wet etching.

As described above, in the present embodiment, because the dielectric layer 120' in the resistor 126 can effectively separate the semiconductor layer 122' and the metal layer 118', the efficiency of the resistor 126 can be effectively improved. In addition, the fabricating processes of the resistor 126 and other semiconductor devices (for example, a MOS transistor and an ESD protection device, etc) can be integrated through the fabricating method described in the present embodiment.

Below, a semiconductor device structure provided by the present invention will be described with reference to FIG. 1C.

Referring to FIG. 1C, the semiconductor device structure includes a substrate 100, a resistor 126, and a gate structure 128. The substrate 100 includes a resistor region 102 and a MOS transistor region 104.

The resistor 126 is disposed on the isolation structure 108 within the resistor region 102. In another embodiment of the present invention, the resistor 126 may be directly disposed on the substrate 100. The resistor 126 includes a dielectric layer 110', a metal layer 118', a dielectric layer 120', and a semiconductor layer 122'. In the resistor 126, the dielectric layer 110' is disposed on the substrate 100, the metal layer 118' is disposed on the dielectric layer 110', the dielectric layer 120' is disposed on the metal layer 118', and the semiconductor layer 122' is disposed on the dielectric layer 120'.

The gate structure 128 is disposed on the substrate 100 within the MOS transistor region 104. The gate structure 128 includes the dielectric layer 110', the metal layer 118', and the semiconductor layer 122'. In the gate structure 128, the dielectric layer 110' is disposed on the substrate 100, the metal layer 118' is disposed on the dielectric layer 110', and the semiconductor layer 122' is disposed on the metal layer 118'.

Additionally, the semiconductor device structure further includes a gate structure 130 disposed on the substrate 100 within the ESD protection device region 106. The gate structure 130 includes the dielectric layer 110', the metal layer 118', the dielectric layer 120', and the semiconductor layer 122'. In the gate structure 130, the dielectric layer 110' is disposed on the substrate 100, the metal layer 118' is disposed on the dielectric layer 110', the dielectric layer 120' is disposed on the portion of the metal layer 118', and the semiconductor layer 122' is disposed on the dielectric layer 120' and the metal layer 118'.

The materials, functions, and formation methods of the components of the semiconductor device structure in FIG. 1C have been described in the embodiment described above therefore will not be described herein.

As described in foregoing embodiment, in the resistor 126 of the semiconductor device structure, the dielectric layer 120' can separate the metal layer 118' and the semiconductor layer 122' so that the resistance of the resistor 126 can be effectively increased. In addition, since there is no dielectric layer 120' formed in the gate structure 128, the device characteristics of a MOS transistor within the MOS transistor region 104 is not affected.

As described above, the embodiment described above has at least one of the following advantages:

1. A highly efficient resistor can be fabricated through the fabricating method in the embodiment described above.

2. The fabricating processes of the resistor and other semiconductor devices can be integrated through the fabricating method in the embodiment described above.

3. According to the semiconductor device structure of the embodiment described above, the resistance of a resistor can be increased without affecting the electrical performance of a MOS transistor within the MOS transistor region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of a semiconductor device structure, comprising:

providing a substrate, wherein the substrate comprises a resistor region;

forming a first dielectric layer on the substrate;

forming a metal layer on the first dielectric layer;

forming a second dielectric layer which is patterned on the metal layer, wherein the second dielectric layer is located within the resistor region;

forming a semiconductor layer on the substrate, wherein the semiconductor layer covers the metal layer and the second dielectric layer;

forming a patterned mask layer on the semiconductor layer, wherein the patterned mask layer within the resistor region is located above the second dielectric layer;

removing a portion of the semiconductor layer, a portion of the second dielectric layer, a portion of the metal layer, and a portion of the first dielectric layer with the patterned mask layer as a mask to define a resistor within the resistor region; and removing the patterned mask layer.

2. The fabricating method according to claim 1, wherein the step of defining the resistor further comprises defining a first gate structure within a MOS transistor region of the substrate, wherein the first gate structure comprises the first dielectric layer, the metal layer, and the semiconductor layer sequentially stacked on the substrate.

3. The fabricating method according to claim 2, wherein a photomask used for forming the second dielectric layer is a salicide block (SAB) layer formation photomask.

4. The fabricating method according to claim 3 further comprising defining a second gate structure within an ESD protection device region of the substrate, wherein the second gate structure comprises the first dielectric layer, the metal layer, the second dielectric layer, and the semiconductor layer sequentially stacked on the substrate, the second dielectric layer is disposed on a portion of the metal layer, and the semiconductor layer is disposed on the second dielectric layer and the metal layer.

5. The fabricating method according to claim 1, wherein a photomask used for forming the second dielectric layer is a SAB layer formation photomask.

6. The fabricating method according to claim 5 further comprising defining a second gate structure within an ESD protection device region of the substrate, wherein the second gate structure comprises the first dielectric layer, the metal layer, the second dielectric layer, and the semiconductor layer sequentially stacked on the substrate, the second dielectric layer is disposed on a portion of the metal layer, and the semiconductor layer is disposed on the second dielectric layer and the metal layer.

7. The fabricating method according to claim 1, wherein the second dielectric layer within the resistor region has a first width, the patterned mask layer within the resistor region has a second width, and the second width is smaller than the first width.

8. The fabricating method according to claim 1, wherein the substrate within the resistor region comprises an isolation structure, and the resistor is formed on the isolation structure.

9. The fabricating method according to claim 1, wherein the first dielectric layer comprises a composite dielectric layer formed by a plurality of dielectric layers.

10. The fabricating method according to claim 1, wherein the method of removing patterned mask layer comprises performing a dry etching process or a wet etching process.

* * * * *